TREATING OF SURFACES OF SEMICONDUCTOR ELEMENTS

Filed May 14, 1965 2 Sheets-Sheet 1

INVENTOR.
FREDERICK L. BLAKE
BY John J. McLaughlin
ATTORNEY

INVENTOR.
FREDERICK L. BLAKE
BY John J. McLaughlin
ATTORNEY

United States Patent Office 3,313,661
Patented Apr. 11, 1967

3,313,661
TREATING OF SURFACES OF SEMICONDUCTOR ELEMENTS

Frederick L. Blake, deceased, late of Scottsdale, Ariz., by Betty Ann Dickson, administratrix, Scottsdale, Ariz., assignor to Dickson Electronics Corporation, Scottsdale, Ariz., a corporation of Delaware
Filed May 14, 1965, Ser. No. 461,583
2 Claims. (Cl. 148—187)

The present invention relates to the treatment of surfaces of semiconductor elements for passivation of such surfaces or for other purposes. The invention relates more in particular to an improved method for applying glass or glass-like films to surfaces of semiconductor elements. This application is a continuation-in-part of copending application Ser. No. 198,825, filed May 31, 1962, now abandoned.

It is well-known in the art concerned with the production of semiconductor elements that certain surfaces, such as at exposed junction edges, require passivation in order to obtain life characteristics consistent with a given design. One method of approaching the passivation of critical surfaces is coating of such surface with a passivating film, such as of certain plastics, glass and the like. One prior art treatment is to pass $O_2$ into contact with the surface of a silicon wafer or die at a temperature of approximately 800° C. to form a surface film of silicon dioxide ($SiO_2$) and then to remove the silicon dioxide film from some of the surfaces. This treatment is limited because at the temperature employed wax masking is impossible. It is also impossible to form the junction before the passivating step because the high temperature employed will either destroy or seriously damage the junction. Another method is to use an organic silicon compound in this same general manner, such as tetraethylsilicate or triethoxyethyl silane. Use of such organic silicon compounds offers certain advantages, but in general they also require the use of high temperatures such as to prevent wax masking, and usually also temperatures high enough to seriously affect the junction, if it has been formed before the passivating step. So far as is known, there is no method available for applying a glass or glass-like film to selected surfaces of a semiconductor element to passivate certain of such surfaces while leaving the remaining surfaces unaffected regardless of the type of semiconductor element being formed or the specific order of steps used in its formation.

Accordingly, the principal object of the present invention is the provision of an improved method of applying a glass or glass-like film to surfaces of semiconductor elements for passivating purposes.

Another object is the provision of an improved process for applying a glass-like film which is versatile and usable in substantially any usual type of semiconductor element.

A further object is the provision of an improved passivating film of glass-like material which permits extensive selection of the specific composition of film utilized.

Other specific objects and features of the present invention will be apparent from the following detailed description taken with the accompanying drawings, wherein.

Figure 3:
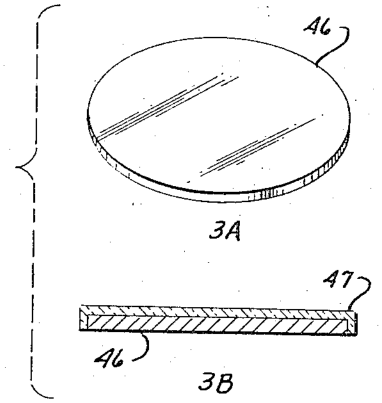
Figures 4, 5:
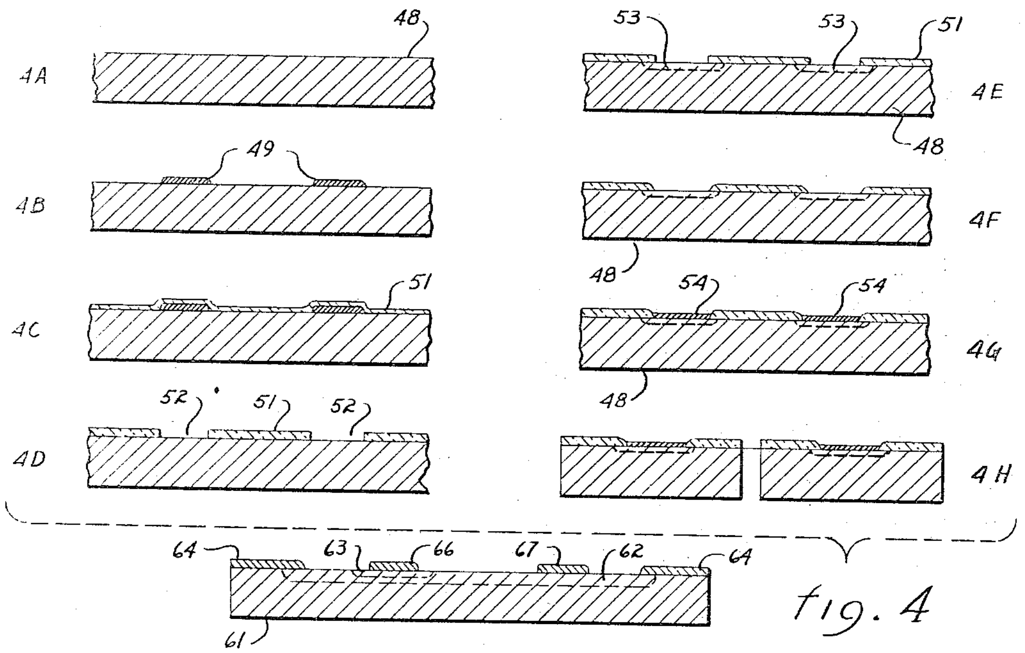

FIGURE 3 indicates the application of the process to a complete wafer which wafer may be used for the production of various types of semiconductor bodies;

FIGURE 4 illustrates the principal steps of forming a planar diode, and

FIGURE 5 indicates a form of transistor which may be passivated by means of the process of the present invention.

Figure 6:
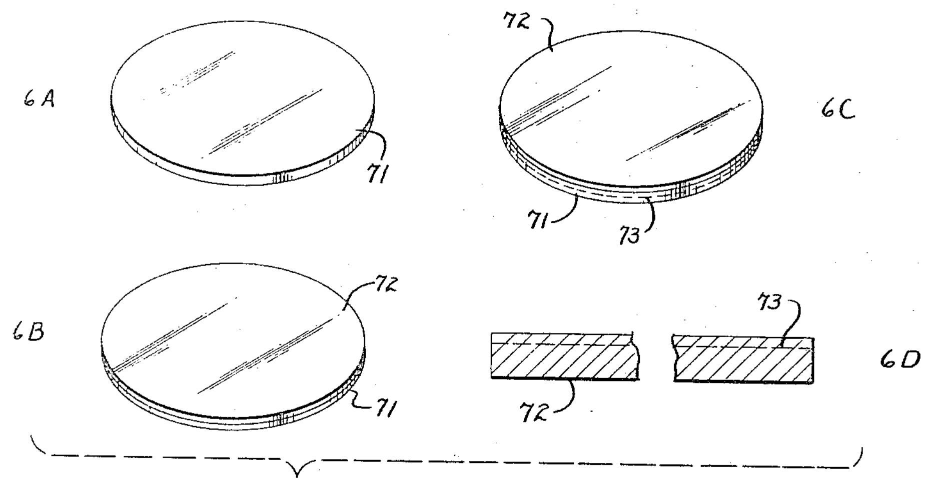

FIGURE 6 indicates application of the process in producing a semiconductor device.

Broadly, the process of the present invention involves sealing the semiconductor element whose surfaces are to be passivated within a recation zone into which is introduced an inert gas together with a relatively small proportion of glass-forming material and water vapor, the individual molecules of which combine with the glass-forming material to form a glass-like film on the surface of the semiconductor element.

For a more specific disclosure reference will be made to the processing equipment indicated in FIGURE 1, and initially it will be assumed for purposes of explanation that the inert gas employed is argon, and that the glass-forming material is silicon tetrachloride.

The dies 10 whose surfaces are to be passivated are supported in shallow dishes 11 which may be formed of Teflon, for example, and these dishes so laden are held in a container 12 with a sealing cover or lid 13. A tube 14 introduces a mixture of argon and water vapor into the reaction zone within the dish 12, and a second tube 16 introduces argon in which is dispersed a proportion of silicon tetrachloride. The water vapor and silicon tetrachloride react at the surface of the dies 10 to form a film of silicon dioxide. The chemical reaction is $$SiCl_4+H_2O=SiO_2+4HCl$$

The hydrochloric acid from the reaction plus the argon is vented through line 17. Suitable precautions, of course, are taken with respect to handling the free hydrochloric acid fumes.

The argon under pressure enters tube 18 to the left of the figure, and thence is delivered through two tubes 19 and 21 to a pair of flow meters 22, valves 23 and 24 being employed to control the flow. Line 19 is connected to line 16 through a valve 26 and a by-pass line 27 runs to a sealed chamber 28 which contains the silicon tetrachloride, the by-pass tube 27 having its discharge below the level of the silicon tetrachloride. Silicon tetrachloride is entrained in the argon gas on delivery to line 16 through additional line 29 which forms the outlet for the sealed container 28.

Similarly, tube 21 is connected to tube 14 through valve 31 and a by-pass line 32 runs to a sealed container 33 containing liquid water, and this water is picked up in vaporous form by the argon and delivered to line 14 through the outlet line 34.

More specific information with respect to control will be given hereinbelow, but, assuming that valves 26 and 31 are suitably adjusted, a back pressure can be generated such as to deliver enough gas through the pipes 27 and 32 as to approximately saturate the argon with vapor of silicon tetrachloride and water vapor.

While the reaction may occur at various temperatures, it is preferable to control the temperature at approximately sixty to seventy degrees centigrade for reasons which will be pointed out. A hot plate 36 may be so heated and the dish 12 adjusted with respect to it that a temperature of between sixty and seventy degrees centigrade will be maintained within the reaction zone. The remaining portion of the apparatus is preferably at ordinary room temperature. The actual mechanism of the reaction appears to be that the water vapor is adsorbed onto the surface of the semiconductor material and the reaction occurs at the surface forming a film at the surface, and this causes the film to be adherent, uniform and continuous.

The argon source employed is suitably a commercial argon tank under pressure, and the pressure should be suitably reduced at the tank outlet by a normal reducer valve provided for this purpose. The valves 23 and 24 are suitably adjusted for the delivery of two standard cubic feet per hour of argon through each flow meter. The valve 26 is adjusted for a bubble rate of about ten bubbles per second in the closed chamber 28. This provides substantially a saturated load of silicon tetrachloride molecules in the argon which is, of course, the maximum amount of silicon tetrachloride which can be picked up at room temperature. The rate can be set at a lower order, even at the rate of one bubble per second, for example, and while the process will be carried out it will be much slower and take a longer time to form a film of a given thickness.

The valve 31 controlling delivery of gas into the closed water chamber 33 may likewise be set to pass about ten bubbles per second through the water. This rate may, of course, also be varied, but usually not without reference to the amount of silicon tetrachloride delivered to the reaction zones. In general it is desirable to provide an excess of $SiCl_4$ over stoichiometric requirements. There are, of course, many methods for controlling the ratio $SiCl_4$ to $H_2O$ entering the reaction zone, but if the bubble rate is to be used as a guide, the level of liquids in the two containers should be the same.

Using argon as a carrier controlled in the manner described, the argon delivered through the tubes 29 and 34 is saturated, and under these conditions the volumetric ratio of $SiCl_4$ to $H_2O$ is about twenty to one. With two cubic feet of argon per hour delivered to tube 19, 1.3 cubic feet pass through the liquid $SiCl_4$, and 0.7 cubic foot is by-passed. In the case of the water, however, 1.7 cubic feet pass through the water, and 0.3 cubic foot is by-passed. If we were to disregard the diminution of the two pregnant gases by the by-passed argon, it will be seen that the twenty to one volume relation would be equivalent to a thirty to one weight ratio, a three to one molar ratio, and a six to one equivalence ratio. Allowing for dilution, this then would result in about one part of water to 4.6 parts of $SiCl_4$ on an equivalency basis.

The deposited glass film should be amorphous, clear and continuous, while the thickness may be anything from a few molecular layers thick to several microns thick. It has been found that for most purposes, however, that a film approximately one micron thick is adequate. Under the conditions of the reaction as pointed out, a one micron film will be produced in approximately twenty-five minutes. If hydrolysis occurs too rapidly, there is a tendency to form crystals in the film, which in general is not desired, although a small amount of crystallization may sometimes be permitted. While a very slow rate of delivery of the reacting molecules will merely increase the time required to produce a film of required thickness, too rapid delivery of reactants has a tendency to produce some reaction above the semiconductor surface and thus produce a crystalline film instead of a smooth, clear, amorphous and continuous film of uniform thickness, such as is desired.

It was postulated hereinabove that water molecules are adsorbed onto the surface of the semiconductor material and that the reaction, therefore, occurs at such surface. This theory tends to be borne out by the conditions found to exist when ten bubbles per second are generated at both the silicon tetrachloride closed container 28 and at the water container 33. It was found that under these circumstances the silicon tetrachloride laden gas going to the reaction zone is substantially saturated and consists of about 68.4% by volume of argon and about 31.6% by volume of silicon tetrachloride. The gas delivered from the closed container 33, however, analyses 96.8% of argon by volume and 3.2% of water by volume. Both of these figures for the two reactants are, of course, reduced by the inclusion of such proportions of pure argon as may by-pass the two liquid containers. It is obvious nevertheless that even though the water molecule is much smaller than the silicon tetrachloride, there is still much less water than would be required to satisfy the stoichiometric relationship of two molecules of water to one of silicon tetrachloride. This means, of course, that there is an excess of silicon tetrachloride, and this appears to have some advantage in reducing the water content and reducing markedly the amount of hydrate produced in the film.

Specific methods of treating the semiconductor element after the passivating treatment will appear from a consideration of the illustrative examples. It is sufficient to note here that in instances where a substantial amount of hydrate is formed—and the proportion of hydrate appears to be somewhat greater in the case of $SiCl_4$ than with some of the other compounds employed—the passivating material will be heated up to as long as twenty-four hours, under a vacuum if necessary, and at a temperature up to two hundred degrees centigrade to reduce to a minimum value the amount of hydrate in the film.

The reaction may actually be carried out over a considerable range of temperatures, but in general the recommended temperature is between sixty and seventy degrees centigrade. The fact that an oxide coating is formed at these relatively low temperatures makes possible the use of Group III or Group V elements as part of the glass-forming composition and limits the doping effect which would otherwise result if the Group III or Group V metal were applied directly or if the temperature were higher.

It will be understood that the argon is merely a carrier and does not participate in the reaction. Therefore, any gas which is inert with respect to the reaction may be used, and this includes besides the rare gases such gases as nitrogen, oxygen and the like. Mixtures of compatible gases may be used, as, for example, in instances where one gas may be used to entrain the water vapor and another gas to entrain the halide compound employed.

A relatively large number of materials may be used to produce a glass or glass-like film. Halides of other Group IV metals may be used, as well as halides of such metals in the third group such as boron, aluminum, gallium and indium. Of the Group V metals, halides of phosphorous, arsenic, and tin, may be employed for example. Mixtures of all such materials may also be used to advantage.

There has been employed the term "halide" in a generic sense to include not only halogen salts of metals but other halogen bearing compounds, such as co-valent compounds as exemplified by silicon and germanium tetrachloride or tetrabromide.

It is known that some of the materials identified will hydrolyze relatively slowly, and, while they will function to produce a good film, they normally give way to such salts as the chlorine salt, and more specifically the chlorine salt of the metal, the surface of which is being passivated. Those materials which form hygroscopic oxides, such, for example, as boron tetrachloride, must be used with care and frequently it is better if they are used only in mixtures, as already pointed out. When mixtures are used which are partly liquid and partly solid, the solid will frequently dissolve in the liquid. If the glass-forming material is solid at ordinary room temperature, however, it may be necessary to pass the gas through a solid body of it at room temperature, or depending upon the vapor pressure, to raise the temperature to a point such that there will be sufficient entrainment. Since these are considerations of general chemistry, there will be no detailed reference to the specific manner of entraining specific compounds in specific gases for introduction into the reaction zone.

EXAMPLE 1

In accordance with one example of practicing the present invention, a plurality of dies 41 are etched from a wafer comprising a doped monocrystal which has been treated to form a junction 42 by the diffusion of a doping layer of material into one face. If, for example, the initial crystal has been doped with a third group metal, such as boron, the junction 42 will be formed by diffusing into one face a fifth group metal such as phophorus. This step of the process is well-known and results in forming either a PN junction or an NP junction, depending on the materials used and order of steps. The opposite planar faces of the die carry wax layers 43. These wax layers are the remains of two wax layers applied to the wafer before etch cutting of the dies therefrom in normal processing. The etch cutting of the dies causes the wax layers 43 to be partly undercut in the manner shown in FIGURE 2A.

Figure 1:
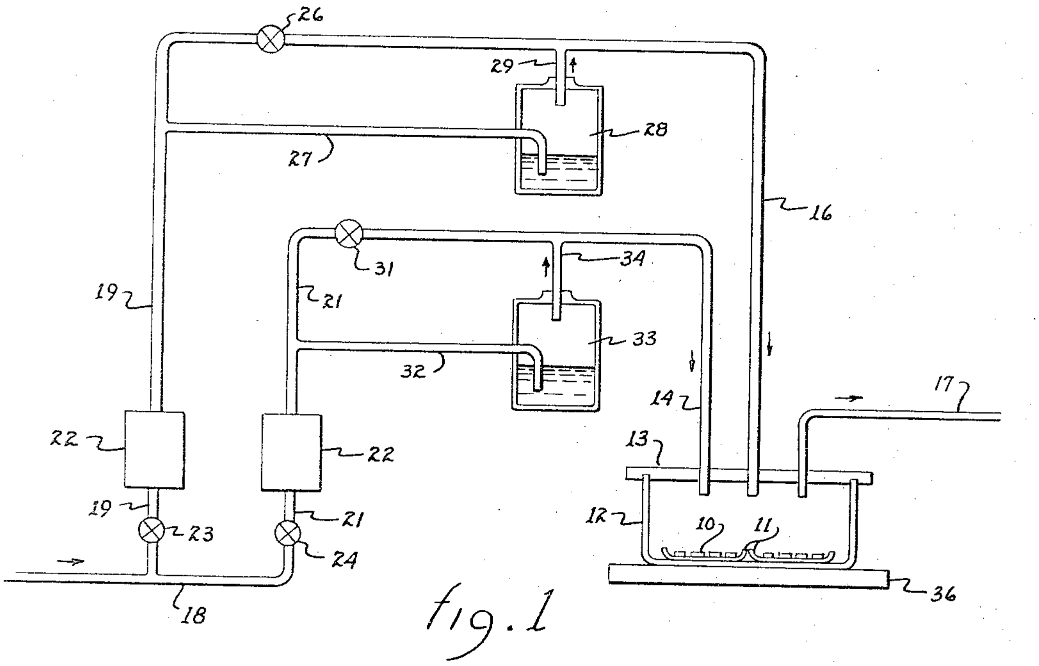
FIGURE 1 is a schematic view illustrating one manner of carrying out the process.
Figure 2:
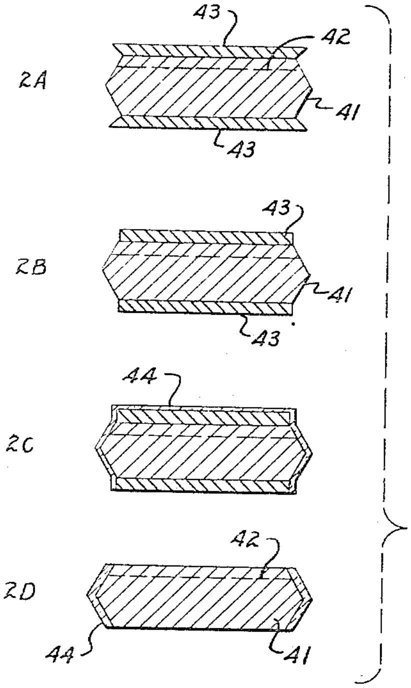
FIGURE 2 illustrates a series of steps utilizable in the production of certain types of diodes.

In carrying out the process of the present invention the freshly etch-cut dies 41 are treated to remove the excess wax from their edges by suitable means, such as treatment in an ultrasonic bath, and the dies rinsed to remove any remaining free wax particles, after which they are dried and the dried dies with wax protected faces, as shown in FIGURE 2B, are then placed on dishes 11, shown in FIGURE 1, and treated in accordance with the process described in connection with FIGURE 1. When silicon tetrachloride is the glass-forming material employed, a thin film 44 of silicon dioxide is applied over the entire surface including the upper wax face. The bottom wax layer does not have a film because the die rests on this face during treatment. A temperature of about sixty degrees centigrade is maintained in the reaction zone, and the argon carried into the reaction zone through lines 16 and 14 is controlled to deliver an equivalent excess silicon tetrachloride vapor as contrasted with water vapor. The reaction time to build the film 44 up one micron thickness is about twenty-five minutes. The dies are then removed from the reaction zone, treated with a solvent such as trichlorethylene to remove the wax and the glass over it, and heated for approximately eighteen hours at two hundred degrees centigrade to dehydrate the film 44. The resulting dies have the appearance shown in FIGURE 2D and are then ready for further treatment in the production of a finished diode.

EXAMPLE 2

A wafer 46 of silicon monocrystal, the surface of which had been chemically polished with a mixture comprising ninety-five percent nitric acid and five percent hydrofluoric acid, is placed in the reaction zone in equipment such as shown in FIGURE 1. Water at controlled level is maintained on the container 33 as in the previous example, but a mixture of glass-forming chemicals is placed in the closed container 28, said mixture comprising three parts of silicon tetrachloride, and one part of tin tetrachloride. The equipment is operated in the usual manner, maintaining a stoichiometric excess of halide molecules. After thirty minutes the surface of the wafer 46 was covered with an amorphous, continuous, substantially transparent film 47, as shown in FIGURE 3B. The wafer so produced has an extremely hard surface highly resistant to scratching. Much less hydration of the film occurs when a mixture of silicon and tin is employed than when the coating comprises only silicon dioxide. In addition to the fact that the larger surface of the wafer is suitable for a study of the properties of the film, there are some types of diodes which may be produced by utilization of a coated wafer, such as shown in FIGURE 3.

EXAMPLE 3

The process of the present invention is particularly suitable for making planar type diodes, and illustrative steps for the production of such a diode are shown in FIGURE 4. Here a doped monocrystal is first produced and a thin wafer cut from it and etched and polished in accordance with conventional practices to produce a wafer 48 as indicated in FIGURE 4A, the broken away side edges indicating that only a small portion of the entire wafer is shown. The wafer 48 is then masked in a plurality of places by the application of small masses of material 49 which may be readily removed, and for this purpose there is successfully used a material known in the trade as photoresist. Of course, it is to be understood that any suitable masking material may be employed. Typical of suitable masking materials are: waxes, greases, oils, paraffin, various photoresist materials such as those containing polyvinyl alcohols, or the like. The entire top face of the silicon wafer is then treated to apply a continuous glass-like film 51 thereto by means of the method and equipment described in connection with FIGURE 1. The film 51 may comprise an oxide of a fourth group metal consisting of silicon, titanium, germanium, zirconium, tin, hafnium and lead, or a mixture of such oxides, to either of which may also be added a proportion of oxides of Group III or Group V metals. Elements from the third and fifth group of elements consisting of boron, aluminum, scandium, gallium, yttrium, indium, lanthanum, thallium, actinum, phosphorus, vanadium, arsenic, columbium, antimony, tantalum and bismuth may be considered among the glass forming metals, and may be used to produce glass coatings in accordance with the teachings of the invention. A film comprising a mixture of silicon and titanium oxide formed by the present method is of particular utility because it has a hydrate content less than that of titanium dioxide by a factor of 100.

As shown in FIGURE 4D, the masking material 49 is removed after application of the film 51 to leave such film with a plurality of round holes 52 co-extensive in area with the areas covered by the masking material 49. Removal of the masking material is accomplished by brushing the film-coated wafer. The masking material is generally softer than the wafer and brushing causes the film deposited over the masking material to crack and break away from the surface thereof. Residual masking material readily is removed by washing with a solvent such as trichloroethylene, methyl ethyl ketone, or the like, or other appropriate means. Alternatively, a solvent for the masking material may be applied directly to the film-coated masking material. Experience has shown that the film over the masking material is usually discontinuous and full of cracks, pin-holes, and the like. Solvent enters these surface defects and removes masking material beneath the film. Film in the previously-masked areas is thus unsupported and ordinarily is carried away with the solvent. Remaining film easily is brushed away. Many other methods may be employed to remove the masking material and its associated film. Typical of these methods are treatment with ultrasound to fracture the film over the masking material and subsequent solvent removal of the masking material, fluid jet treatment to substantially simultaneously remove masking material and its associated film, and the like.

A small amount of doping material is then added to the wafer 48 at each opening 52 and the wafer heated to diffuse the doping material into the body of the wafer to produce a series of junctions 53, the edges of which extend under the glass film 51, as shown in FIGURE 4E. Any of the usual practices may be followed in diffusing doping material into the top face of the wafer to produce the plurality of junctions 53. To complete the formation of the individual planar diode elements the top surface is usually sand-blasted to remove the remaining diffusion material on the surface, and this process results in some breakdown of the side edges of the glass, as shown in FIGURE 4F, but not enough to deleteriously affect the junctions 53 nor the protecting glass film covering its edges. The wafer is then treated to apply a top surface 54 for soldering or the like, which top face may, for example, be a thin layer of nickel covered with a thin layer of gold. The individual dies are then cut out as shown in FIGURE 4H to produce individual planar diode element from which the finished planar diode is formed.

EXAMPLE 4

A plurality of germanium dies were made in accordance with the general process described in connection with Example 1. With the flat surfaces protected by a wax coating as shown in FIGURE 2B, dies were placed in the reaction chamber of FIGURE 1 and vaporous germanium tetrachloride and water vapor dispersed in neon and introduced into such chamber. To disperse the said vapors in neon, $GeCl_4$ was introduced into the closed vessel 28 and water into the closed vessel 33. Neon gas was introduced below the level of each liquid, and the apparatus controlled to deliver into the reaction zone one molecule of water for each two molecules of germanium tetrachloride, or a fourfold excess of germanium tetrachloride over stoichiometric requirements. Action was continued for about three quarters of an hour until a smooth, continuous, amorphous and substantially transparent germanium oxide film was formed on the peripheral surface and over the exposed junction edges of the germanium dies. Thereafter such dies were treated in the general manner previously described to produce a finished semiconductor device.

EXAMPLE 5

A transistor as shown in FIGURE 5 and consisting of a collector 61, base 62, emitter 63, and glass-like film 64 was produced in the general manner disclosed for the production of a planar diode. The base portion was produced by a diffusion method after the application of the glass surface 64 so that the diffusion took place partly under the surface of the glass, thereby effectively sealing and passivating the junction between the base and collector. The emitter 63 was formed by an alloying method, and the two electrodes 66 and 67 later soldered in place over a gold surface previously applied.

The semiconductor body from which the transistor was produced was a doped germanium monocrystal, and the glass was formed by passing into the reaction zone along with water vapor a mixture of one part germanium tetrachloride and one part silicon tetrachloride, so that the glass film 64 comprised an intimate mixture of germanium and silicon oxides.

Since the process of the present invention results in the formation of a very uniform film of glass-like material, the steps of the process in other ways in the production of semiconductor elements may be utilized. As an example, it may be applied to a smooth outer face of a semiconductor wafer or die formed from a monocrystal a glass-like film comprising a Group III or Group V metal, such as boron and aluminum of Group III or phosphorus, arsenic or antimony from Group V. The semiconductor material with its said adherent film may then be introduced into a diffusion furnace to cause the Group III or Group V metal, as the case may be, to diffuse into the face of a doped or substantially pure semiconductor body and thus to provide a thin, very uniformly doped layer and a resulting P-N junction of extremely uniform characteristics. This provides a new tool for the production of diffused layers and junction between such layers and the remaining portion of the semiconductor bodies. This technique may be combined with other processing techniques, and, of course, the method of the present invention may be used to stabilize a PN junction formed by diffusing a doping material from a thin uniform metal oxide film.

EXAMPLE 6

A thin wafer 71 (FIGURE 6A) is cut from a silicon monocrystal and etched and polished in any usual way to provide a very smooth upper surface. The wafer 71 is then placed in reaction vessel 12 with the polished face exposed. It may be noted that the wafer 71 has the same general appearance as the wafer 46 shown in FIGURE 3A. A mixture of one part of silicon tetrachloride and one part of boron trichloride is then introduced into the closed vessel 26 (FIGURE 1) and water introduced into the closed vessel 33. Using helium as a carrying gas, a vaporous mixture of silicon tetrachloride and boron trichloride dispersed in helium is introduced into the reaction chamber together with water vapor, also dispersed in helium. Hydrolysis of the mixed molecules of silicon tetrachloride and boron trichloride occurs at the exposed surface of the wafer 71, producing a smooth imperforate film 72 comprising an intimate mixture of $SiO_2$ and $B_2O_3$.

The wafer 71 with its adherent film 72 will now have the general appearance shown in FIGURE 6B of the drawings. The coated wafer 71 of FIGURE 6B is then introduced into a diffusing furnace and subjected to a temperature of about twelve hundred degrees centigrade for about five and a half hours. A very thin diffused layer of silicon is thereby formed, and this results in the formation of a uniform junction 73. The remaining film 72 may then be removed by suitable means, such as by etching with hydrofluoric acid or by sandblasting, or any suitable combination of techniques to produce an intermediate product for further processing in accordance with usual techniques to produce a finished semiconductor device.

EXAMPLE 7

Proceeding as in the previous example, a silicon wafer is introduced into the reaction zone together with a relatively small amount of water vapor, nitrogen being used as the carrier gas. One part of phosphorus oxychloride is then dissolved in one part of silicon tetrachloride and the mixture introduced into the closed chamber 28. Nitrogen is passed through the chamber 28 to carry a mixture of phosphorus oxychloride and silicon tetrachloride into the reaction zone. Reaction was allowed to proceed until a thin, glass-like film of mixed $SiO_2$ and mixed phosphorus oxides (anhydrides) approximately two microns thick was deposited uniformly along the top surface of the wafer. The glass-like film coated wafer was then introduced into a diffusion furnace and heated at twelve hundred degrees centigrade for six hours. A uniform layer containing diffused phosphorus was thus produced with a uniform portion between such layer and the main body of the wafer. As in this and in the previous example, the resulting wafer with its diffused layer may then be treated with conventional processing techniques to produce finished semiconductor devices.

The invention has been shown and described in such detail as to permit those skilled in the art to understand the same fully, but the scope of the invention is defined by the claims.

What is claimed is:

1. The method of forming a planar diode which comprises:

(a) applying a masking material to a relatively small surface of a wafer comprising a doped monocrystal of a semiconductor material, (b) contacting surfaces of said wafer with disperse molecules of a halide of a glass-forming metal selected from Groups III, IV, and V of the periodic table, (c) hydrolyzing said metal halide molecules with water vapor to form a glass-like oxide film adherent to said exterior surface including said masked surface, (d) removing said masking material and adherent film to form a coating free surface, and (e) diffusing a doping material into the wafer at said surface to form a PN junction, the edges of which extend under the said glass-like film.

2. The method of passivating a surface of a semiconductor element comprising:

(a) forming a first gaseous mixture of an inert carrier gas and water vapor;

(b) forming a second gaseous mixture of an inert carrier gas and a volatilized hydrolyzable halide of a glass-forming metal selected from Groups III, IV and V of the Periodic Table;

(c) simultaneously contacting said semiconductor surface with said gaseous mixtures in a reaction zone maintained at about 60–70° C.

thereby to form a passivating film comprising an oxide of said glass-forming metal on said semiconductor surface.

References Cited by the Examiner

UNITED STATES PATENTS

| | | | |
|---|---|---|---|
| 2,572,497 | 10/1951 | Herr | 117—106 X |
| 2,802,760 | 8/1957 | Derick | 148—189 |
| 2,804,405 | 8/1957 | Derick | 148—187 |
| 2,898,229 | 8/1959 | Law | 117—106 X |
| 2,974,073 | 3/1961 | Armstrong | 148—189 |
| 3,064,167 | 11/1962 | Hoerni | 148—187 |
| 3,114,663 | 12/1963 | Klerer | 148—186 |
| 3,133,840 | 5/1964 | Gibson | 148—189 |
| 3,175,922 | 3/1965 | Blocher | 117—106 |

FOREIGN PATENTS

| | | |
|---|---|---|
| 232,475 | 11/1958 | Australia. |

HYLAND BIZOT, *Primary Examiner.*

DAVID L. RECK, *Examiner.*